(12) United States Patent
Ito

(10) Patent No.: US 9,543,933 B2
(45) Date of Patent: Jan. 10, 2017

(54) CONTROL CIRCUIT, DCDC CONVERTER, AND DRIVING METHOD

(75) Inventor: Yoshiaki Ito, Tokyo (JP)

(73) Assignee: Semiconductor Energy Laboratory Co., Ltd. (JP)

( * ) Notice: Subject to any disclaimer, the term of this patent is extended or adjusted under 35 U.S.C. 154(b) by 26 days.

(21) Appl. No.: 13/241,510

(22) Filed: Sep. 23, 2011

(65) Prior Publication Data

US 2012/0081091 A1    Apr. 5, 2012

(30) Foreign Application Priority Data

Sep. 30, 2010    (JP) .................................. 2010-222036

(51) Int. Cl.
| | | |
|---|---|---|
| *G05F 1/00* | (2006.01) | |
| *H03K 4/06* | (2006.01) | |
| *H02M 3/156* | (2006.01) | |
| *H03K 7/08* | (2006.01) | |
| *H02M 1/00* | (2006.01) | |

(52) U.S. Cl.
CPC .............. *H03K 4/06* (2013.01); *H02M 3/156* (2013.01); *H03K 7/08* (2013.01); *H02M 2001/0003* (2013.01)

(58) Field of Classification Search
CPC ...... H02M 3/145; H02M 3/155; H02M 3/156; H02M 3/1563; H02M 3/1566; H02M 3/157; H02M 3/158; H02M 3/1588; H02M 3/06; H02M 3/07; H02M 2001/0025; H02M 2003/071; H02M 2003/072; H02M 2003/073; H02M 2003/075; H02M 2003/076; H02M 2003/077; H02M 2003/078; H02M 3/1584; H02M 2003/1566; H02M 2001/0032; H02M 2001/0003; H03K 4/00; H03K 4/06; H03K 4/063; H03K 4/066; H03K 4/08; H03K 4/48; H03K 4/787; H03K 4/83; H03K 4/90; H03K 4/50; H03K 4/501; H03K 4/502; H03K 7/08; Y02B 70/1466

(Continued)

(56) References Cited

U.S. PATENT DOCUMENTS 5,767,736 A *  6/1998  Lakshmikumar ..... H03L 7/0896
                                                        327/157
6,191,630 B1 *  2/2001  Ozawa et al. ................. 327/278

(Continued)

FOREIGN PATENT DOCUMENTS

| EP | 1 351 387 A2 | 10/2003 |
|---|---|---|
| JP | 10-248238 | 9/1998 |

(Continued)

OTHER PUBLICATIONS

English translation (JP2001112251).*

(Continued)

*Primary Examiner* — Timothy J Dole
*Assistant Examiner* — Carlos Rivera-Perez
(74) *Attorney, Agent, or Firm* — Husch Blackwell LLP

(57) ABSTRACT

A current generator circuit included in a triangle-wave generator circuit in a control circuit includes plural stages of current mirrors connected in parallel with each other. The plural stages of current mirrors are placed so that the sum of output currents output therefrom becomes an output current of the current generator circuit. A switching element that controls the on/off state of a current in accordance with the amount of load current of a DCDC converter is connected to each of the current mirrors.

14 Claims, 7 Drawing Sheets

(58) Field of Classification Search
USPC ............... 323/282–288, 351, 222–226, 271–275,323/312, 315, 316, 242, 326; 327/131–140, 327/175, 113–123; 331/34, 37, 40, 41, 111, 331/143, 175, 176; 363/59–61
See application file for complete search history.

(56) References Cited

U.S. PATENT DOCUMENTS

| | | | |
|---|---|---|---|
| 6,448,752 | B1 | 9/2002 | Umemoto |
| 6,956,431 | B2 | 10/2005 | Maejima |
| 6,980,054 | B2 | 12/2005 | Okada |
| 7,317,362 | B2 | 1/2008 | Sakuma et al. |
| 7,923,980 | B2 | 4/2011 | Takahashi et al. |
| 2001/0054883 | A1* | 12/2001 | Rincon-Mora ............... 323/280 |
| 2002/0171457 | A1* | 11/2002 | Fujiwara ...................... 327/113 |
| 2003/0107358 | A1 | 6/2003 | Isham et al. |
| 2004/0027106 | A1* | 2/2004 | Martins ........................ 323/282 |
| 2004/0169553 | A1* | 9/2004 | Maejima ........................ 330/10 |
| 2006/0033579 | A1 | 2/2006 | Okada |
| 2006/0250190 | A1 | 11/2006 | Okada |
| 2009/0237049 | A1* | 9/2009 | Hachiya et al. ............. 323/282 |
| 2009/0237058 | A1* | 9/2009 | Mulligan et al. ............ 323/288 |
| 2011/0057636 | A1* | 3/2011 | Su et al. ...................... 323/285 |
| 2011/0068852 | A1 | 3/2011 | Yamazaki et al. |
| 2011/0095787 | A1 | 4/2011 | Ohmaru et al. |

FOREIGN PATENT DOCUMENTS

| | | |
|---|---|---|
| JP | 11-41914 | 2/1999 |
| JP | 2000-013204 A | 1/2000 |
| JP | 2001-112251 | 4/2001 |
| JP | 2004-248374 A | 9/2004 |
| JP | 2004-282714 A | 10/2004 |
| TW | 200306700 | 11/2003 |

OTHER PUBLICATIONS

English translation (JP10248238).*
Taiwanese Office Action re Application No. TW 100135014, dated Oct. 15, 2015.

* cited by examiner

Prior Art

CONTROL CIRCUIT, DCDC CONVERTER, AND DRIVING METHOD

BACKGROUND OF THE INVENTION

1. Field of the Invention

The present invention relates to a control circuit. Further, the present invention relates to a DCDC converter controlled by the control circuit and a driving method thereof.

2. Description of the Related Art

PWM control is known as one of methods for controlling a DCDC converter that changes output power in accordance with the load of a circuit and outputs stable voltage.

Pulse width modulation (PWM) is a modulation method of changing the duty cycle of an output pulse. For example, in the case of applying PWM to a DCDC converter, an output voltage can be close to a desired value in the following manner: the difference between an intended voltage and an output voltage that varies depending on the size of a load of a circuit connected to the output side of the DCDC converter is fed back, and the duty cycle of an output pulse is changed in accordance with the difference.

As an example of a conventional DCDC converter, FIG. 6 illustrates an example of a step-up DCDC converter to which a control circuit is connected. A DCDC converter 10 includes a control circuit 20, a switching transistor 11, an inductor 13, a diode 15, a capacitor 17, a resistor 19a, and a resistor 19b. Moreover, the DCDC converter 10 has an input terminal (POWER) to which a DC power source is connected, and an output terminal (OUTPUT) connected to a load circuit.

An output terminal of the control circuit 20 is connected to a gate of the switching transistor 11. The on/off state of the switching transistor 11 is controlled with a pulse output from the control circuit 20.

When the switching transistor 11 is on, a current flows through the inductor 13 in accordance with the difference between an input voltage and a ground voltage. Since electromotive force is generated by self induction in the direction opposite to that of the current flowing through the inductor 13, the current is gradually increased.

Next, when the switching transistor 11 is turned off, the path of the current that has passed through the inductor 13 until then is interrupted. In the inductor 13, electromotive force is generated in the direction that interferes with the change of this current, that is, in the direction opposite to that at the time when the switching transistor 11 is on. Thus, a current corresponding to this electromotive force flows through the inductor 13. At this time, the potential of a node between the inductor 13 and the diode 15 is higher than the potential of the input terminal, so that a voltage higher than an input voltage (a power supply voltage of the DC power source) is output to the output terminal of the DCDC converter 10. The converter with this configuration is therefore called a step-up converter.

The potential of the node between the inductor 13 and the diode 15 at the time when the switching transistor 11 is off is increased in proportion to the current that has flowed through the inductor 13 just before the switching transistor 11 is turned off. In other words, the longer the time during which the switching transistor 11 is on is, the higher the potential of the node is. Thus, when the duty cycle of an output pulse signal of the control circuit 20 is high, the voltage can be stepped up so that the difference between the output voltage and the input voltage is large, whereas when the duty cycle is small, the voltage can be stepped up so that the difference of these voltages is small. By adjusting the duty cycle, the output voltage of the DCDC converter 10 can be closed to a desired voltage.

Here, the control circuit 20 includes a triangle-wave generator circuit 21, an error amplifier 23, and a PWM buffer 25. The error amplifier 23 outputs a voltage signal whose level corresponds to the difference between the output voltage of the DCDC converter 10 and a desired voltage. The PWM buffer 25 outputs a pulse having a waveform with a duty cycle corresponding to the above voltage difference to the gate of the switching transistor 11, by using an output voltage from the error amplifier 23 and a triangle-wave voltage output from the triangle-wave generator circuit 21.

FIG. 7 is a schematic diagram of two input signals input from the triangle-wave generator circuit 21 and the error amplifier 23 to the PWM buffer 25, and an output signal of the PWM buffer 25 generated with the input signals. Here, a solid line 51 indicates the input signal input from the triangle-wave generator circuit 21 to the PWM buffer 25. A solid line 53 indicates the input signal input from the error amplifier 23. A solid line 55 indicates the output signal of the PWM buffer 25. The PWM buffer 25 in this configuration compares a voltage of the input signal from the error amplifier 23 and a voltage of the input signal from the triangle-wave generator circuit 21, and outputs a high-level voltage when the voltage of the input signal from the triangle-wave generator circuit 21 is the higher and outputs a low-level voltage when the voltage of the input signal from the triangle-wave generator circuit 21 is the lower. As illustrated in FIG. 7, the duty cycle of the output pulse from the PWM buffer 25 is changed in accordance with the level of the voltage of the input signal from the error amplifier 23, that is, in accordance with the difference between the output voltage of the DCDC converter 10 and a desired voltage.

In general, when considering the power efficiency of a DCDC converter, power loss due to components other than a control circuit (e.g., parasitic resistance of an inductor and a capacitor, voltage across a diode, and on-resistance of a switching transistor) is a dominant factor on the high output power side with a large load current. On the other hand, on the low output power side with a small load current, power loss due to the control circuit is a dominant factor in degradation of power efficiency.

When considering factors in power loss due to the control circuit, power loss due to a PWM buffer is the largest among three circuit elements of a triangle-wave generator circuit, an error amplifier, and the PWM buffer. Specifically, power loss due to the influence of charging and discharging of gate capacitance of a switching transistor connected to the PWM buffer is given. The power loss at the time of switching is proportional to the value of the gate capacitance of the switching transistor and proportional to switching cycles per unit time, that is, the sampling frequency. Here, the sampling frequency is a frequency equal to the oscillation frequency of a triangle wave output from the triangle-wave generator circuit.

Therefore, the sampling frequency needs to be lowered in order to increase the power efficiency on the low output power side of a DCDC converter. In light of the above, a method of changing the oscillation frequency of a triangle-wave generator circuit has been proposed (Patent Document 1).

REFERENCE

Patent Document 1: Japanese Published Patent Application No. 2001-112251

SUMMARY OF THE INVENTION

As described above, the power efficiency of a DCDC converter is varied depending on its output power. Thus, it is conventionally necessary that an optimal DCDC converter is selected among a plurality of DCDC converters with different specifications in accordance with the value of power consumption (or a variable range of power consumption) of a load circuit connected to the DCDC converter. As a result, a DCDC converter applicable to a wide range of output power has been demanded.

However, in order to achieve a DCDC converter that is widely compatible with load circuit elements for various applications, it is necessary to use a control circuit that can control the DCDC converter so that the DCDC converter operates at the highest efficiency in accordance with power consumption of a load circuit element connected thereto. In particular, a reduction in the sampling frequency as described above is effective in increasing the power efficiency on the low output power side of the DCDC converter. Meanwhile, the use of a control circuit that can widen the variable range of the sampling frequency or can select values of a plurality of sampling frequencies is effective in applying the DCDC converter to a wide range of applications, that is, load circuit elements with various power consumption values.

Patent Document 1 discloses a method for lowering the oscillation frequency of a triangle-wave generator circuit by switching current sources, which serve as a reference in a unit forming a current mirror in the triangle-wave generator circuit in a control circuit, in accordance with a load current output from a power source circuit. However, with this method, the variable range of oscillation frequency cannot be widened. Specifically, in order to increase the oscillation frequency, for example, by about one order of magnitude, a current of a current source for a current mirror needs to be changed by about one order of magnitude; thus, a voltage applied to transistors included in the current mirror is largely changed. If a current is to be changed largely in such a manner, the current mirror cannot operate normally since it operates outside the saturation region because of the Early effect of the transistor, for example, and an expected oscillation frequency might not be obtained.

Except for the above method, there is also proposed a method for changing the oscillation frequency by changing the output impedance of a triangle-wave generator circuit by using a resistor and a switch. However, with this method, the oscillation frequency might be greatly varied depending on variation in resistance of resistors when the triangle-wave generator circuit is formed inside an integrated circuit. Further, the oscillation frequency is proportional to the resistance of a resistor; therefore, in order to increase the oscillation frequency to several tens of times, for example, a resistor of a commensurate size needs to be used, which leads to an increase in circuit size. Consequently, this method is impractical in terms of cost and the like.

The present invention is made in view of the foregoing technical background. An object of the present invention is to provide a DCDC converter that achieves optimal power efficiency regardless of power consumption of a load circuit. Another object is to provide a control circuit with a wide variable range of sampling frequency.

In order to achieve the above objects, a triangle-wave generator circuit with a wide variable range of oscillation frequency is applied to a control circuit.

A triangle-wave generator circuit includes a current generator circuit and a capacitor. The oscillation frequency of the triangle-wave generator circuit is proportional to the inverse of the time it takes to charge and discharge the capacitor. That is, the oscillation frequency is proportional to the inverse of the capacitance of the capacitor and a current value supplied from the current generator circuit.

A current generator circuit included in a triangle-wave generator circuit according to one embodiment of the present invention includes plural stages of current mirrors connected in parallel with each other. The plural stages of current mirrors are placed so that the sum of output currents output therefrom becomes an output current of the current generator circuit.

The output current from the current mirror of each stage is determined in accordance with the sizes of transistors connected to constitute the current mirrors. In addition, a switching element is connected to each of the current mirrors, and the on/off state of the current output from each stage is controlled by on/off operation of the switching element. Here, the size of a transistor means a ratio of channel width to channel length (W/L) of the transistor.

Thus, by controlling the switching element connected to the current mirror of each stage, the output current of the current generator circuit can be changed. Further, with an appropriate combination of the sizes of transistors included in current mirrors, the output current of the current generator circuit can have a wider variable range.

In a DCDC converter according to one embodiment of the present invention, switching elements connected to constitute current mirrors in the current generator circuit are controlled to change the output current of the current generator circuit in accordance with the level of an output current of the DCDC converter so that the oscillation frequency realizes an optimal sampling frequency of a PWM control signal.

One embodiment of the present invention is a control circuit for a DCDC converter, which includes a triangle-wave generator circuit including a capacitor and a current generator circuit configured to charge and discharge the capacitor. The current generator circuit includes a plurality of current mirrors connected in parallel with each other. A current of at least one of the plurality of current mirrors is controlled in accordance with a control signal. The oscillation frequency of a triangle wave is changed by change in a current supplied to the capacitor.

One embodiment of the present invention is a DCDC converter including the above-described control circuit.

Another embodiment of the present invention is a method for driving a DCDC converter, in which a control signal is output to a switching element of a current mirror in accordance with the level of a load current to change a sampling frequency.

The triangle-wave generator circuit including the above current generator circuit can have a wide variable range of oscillation frequency; thus, by using such a triangle-wave generator circuit, the control circuit can have a wide variable range of sampling frequency. In addition, by applying such a control circuit to a DCDC converter, the DCDC converter can achieve optimal power efficiency regardless of power consumption of a load circuit.

Note that in this specification and the like, a control circuit refers to a circuit that has a function of controlling driving of a DCDC converter by a PWM control method, unless otherwise specified.

According to the present invention, it is possible to provide a DCDC converter that achieves optimal power efficiency regardless of power consumption of a load circuit.

In addition, it is possible to provide a control circuit with a wide variable range of sampling frequency.

DETAILED DESCRIPTION OF THE INVENTION

Figure 1:
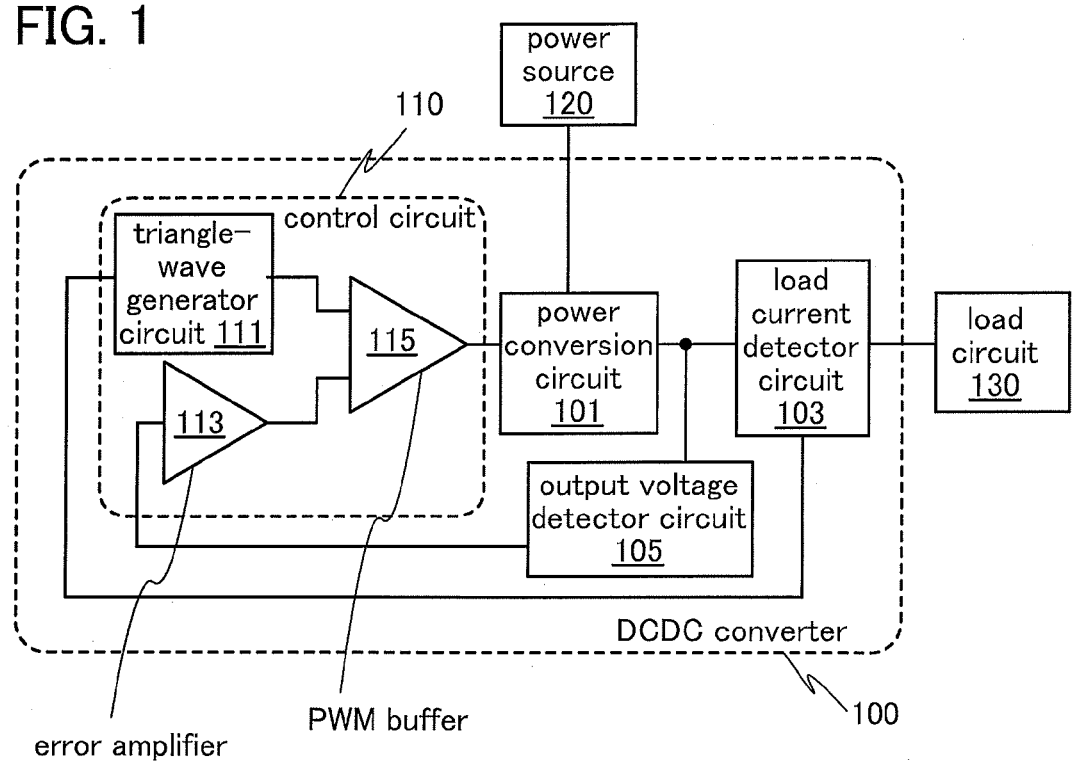
FIG. 1 is a block diagram illustrating one embodiment of the present invention.

Embodiments will be described in detail with reference to the accompanying drawings. Note that the present invention is not limited to the following description, and it will be easily understood by those skilled in the art that various changes and modifications can be made without departing from the spirit and scope of the present invention. Therefore, the present invention should not be limited to the descriptions of the embodiments described below. Note that in the configurations of the invention described below, the same portions or portions having similar functions are denoted by the same reference numerals in different drawings, and description of such portions is not repeated.

A transistor is one of semiconductor elements and can achieve amplification of current or voltage, switching operation for controlling conduction or non-conduction, and the like. A transistor in this specification includes an insulated-gate field effect transistor (IGFET) and a thin film transistor (TFT).

Functions of a "source" and a "drain" are sometimes replaced with each other when a transistor of opposite polarity is used or when the direction of current flowing is changed in circuit operation, for example. Therefore, the terms "source" and "drain" can be replaced with each other in this specification.

In this specification and the like, one of a source and a drain of a transistor is called a "first electrode" and the other of the source and the drain is called a "second electrode" in some cases. Note that in that case, a gate may be referred to as a "gate" or a "gate electrode".

Note that in this specification and the like, the term "electrically connected" includes the case where components are connected through an object having any electric function. There is no particular limitation on an object having any electric function as long as electric signals can be transmitted and received between components that are connected through the object. Examples of an object having any electric function are a switching element such as a transistor, a resistor, an inductor, a capacitor, and an element with a variety of functions as well as an electrode and a wiring.

Note that a node in this specification and the like refers to an element (e.g., a wiring) that can realize electrical connection between elements included in a circuit. Therefore, "a node to which A is connected" refers to a wiring that is electrically connected to A and assumed to have the same potential as A. Note that when one or more elements that can realize electrical connection (e.g., a switch, a transistor, a capacitor, an inductor, a resistor, or a diode) is/are inserted in the wiring, a portion of the wiring which is connected to a terminal of the element(s) on the side opposite to A can be regarded as the "node to which A is connected" as long as the portion has the same potential as A.

In this specification and the like, in the case where a circuit includes a plurality of elements or a plurality of structural units including a plurality of elements and they have common functions, (n) is sometimes added to their references in order to describe configurations, functions, and the like common to the elements or the structural units. Further, (1 to n) is sometimes added to their references in order to represent some or all of the elements or the structural units having common functions.

(Embodiment 1)

In this embodiment, structural examples of a DCDC converter and a control circuit to which a triangle-wave generator circuit with a wide variable range of oscillation frequency is applied will be described with reference to FIG. 1, FIGS. 2A and 2B, and FIG. 3.

FIG. 1 is a block diagram illustrating a configuration of a DCDC converter.

A power source 120 is connected to an input side of a DCDC converter 100 exemplified in this embodiment, and a load circuit 130 is connected to an output side thereof. The DCDC converter 100 includes a control circuit 110, a power conversion circuit 101 to which an output of the control circuit 110 and the power source 120 are connected, a load current detector circuit 103 connected to an output of the power conversion circuit 101, and an output voltage detector circuit 105.

The power conversion circuit 101 outputs a stable voltage to the load circuit 130 using power input from the power source 120 and a PWM control signal input from the control circuit 110. As the power conversion circuit 101, a conversion circuit that controls an output voltage by controlling a switching transistor with a PWM control signal, such as a step-down converter, a step-up converter, or a step-up/down converter, can be used, for example.

The output voltage detector circuit 105 has a function of monitoring an output voltage of the power conversion circuit 101 and outputs a voltage level signal corresponding to the output voltage to an error amplifier 113 described later in the control circuit 110.

The load current detector circuit 103 has a function of detecting a current (hereinafter also referred to as a load current) flowing through the load circuit 130 connected to the DCDC converter 100. Further, the load current detector circuit 103 outputs a control signal for controlling a current generator circuit in a triangle-wave generator circuit 111 described later so that the oscillation frequency of a triangle wave that the triangle-wave generator circuit 111 is to output is changed in accordance with the value of a detected load current.

Next, a configuration of the control circuit 110 will be described. Like a conventional control circuit described above, the control circuit 110 includes the triangle-wave generator circuit 111, the error amplifier 113, and a PWM buffer 115.

The error amplifier 113 compares the voltage level signal output from the output voltage detector circuit 105 and the value of a desired output voltage of the DCDC converter 100, and outputs an output signal with a voltage level corresponding to the difference to the PWM buffer 115. The triangle-wave generator circuit 111 outputs a triangle wave having an oscillation frequency that specifies a sampling frequency of the DCDC converter 100 to the PWM buffer 115. The PWM buffer 115 compares the voltage level of the triangle wave input from the triangle-wave generator circuit 111 and the voltage level of the input signal input from the error amplifier 113, and outputs a PWM control signal that has a frequency equal to the oscillation frequency of the triangle wave and has an appropriate duty cycle corresponding to the voltage level signal to the power conversion circuit 101.

Here, the triangle-wave generator circuit 111 in this configuration has a function capable of outputting a plurality of triangle waves with different oscillation frequencies. In addition, the oscillation frequencies are selected as appropriate by a current control signal output from the load current detector circuit 103.

Figure 2A:
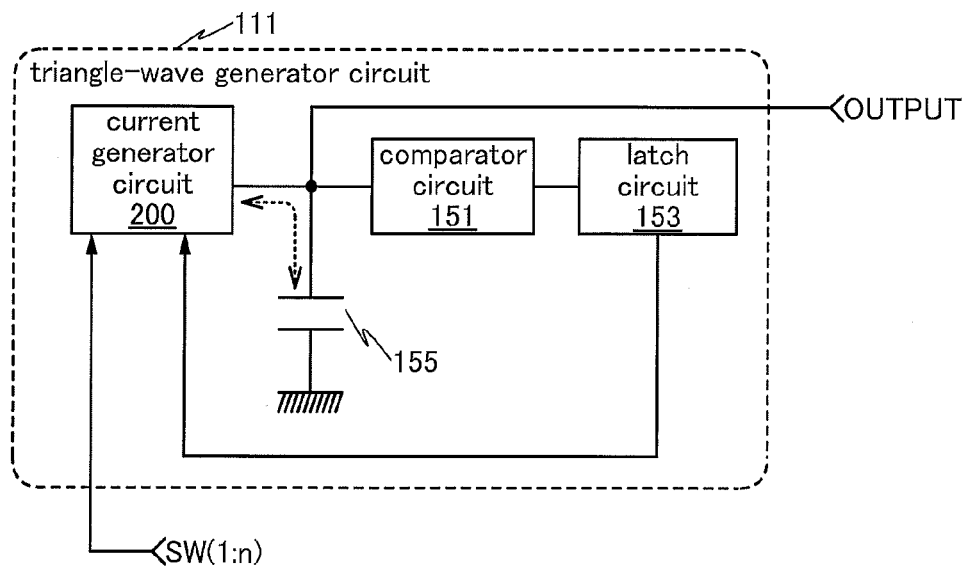
FIGS. 2A and 2B are a block diagram and a circuit diagram illustrating one embodiment of the present invention.

Next, an example of a configuration of the triangle-wave generator circuit 111 that realizes the above function will be described in detail. FIG. 2A is a block diagram of the configuration of the triangle-wave generator circuit 111.

The triangle-wave generator circuit 111 includes a current generator circuit 200, a comparator circuit 151, a latch circuit 153, and a capacitor 155.

The current generator circuit 200 outputs a forward current or a reverse current toward the capacitor 155. The capacitor 155 is charged and discharged with this current, and a voltage of a node connected to an anode of the capacitor 155 (which corresponds to the output node) is changed along with the charge and discharge.

The comparator circuit 151 compares the voltage of the output node with an upper limit voltage VREFH and an lower limit voltage VREFL. When the voltage of the output node is higher than the upper limit voltage VREFH or is lower than the lower limit voltage VREFL, the comparator circuit 151 outputs a signal with which an output of the latch circuit 153 connected thereto is inverted.

Figure 2B:
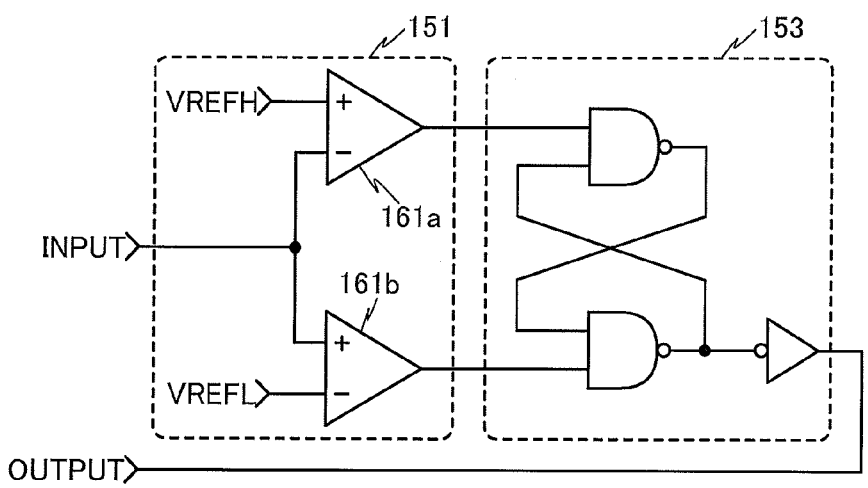

For example, the comparator circuit 151 and the latch circuit 153 can have configurations illustrated in FIG. 2B.

The comparator circuit 151 is constituted by two comparators (a comparator 161a and a comparator 161b). The output node of the triangle-wave generator circuit 111 is connected to an −input terminal of the comparator 161a and an +input terminal of the comparator 161b. The upper limit voltage VREFH is input to an +input terminal of the comparator 161a, and the lower limit voltage VREFL is input to an −input terminal of the comparator 161b. Outputs of the two comparators are input to the latch circuit 153 constituted by a NAND flip-flop circuit.

Here, when the direction of a current output from the current generator circuit 200 is the direction of charging the capacitor 155, the voltage of the output node is gradually raised. When the voltage of the output node exceeds the upper limit voltage VREFH, the output of the comparator 161a is changed from a high potential to a low potential, and a high potential is input from the latch circuit 153 to the current generator circuit 200. With this voltage signal, the direction of the current output from the current generator circuit 200 is reversed, and the current flows in the direction of discharging the capacitor 155 and at the same time, the voltage of the output node starts to be decreased. Then, when the voltage of the output node becomes lower than the lower limit voltage VREFL, the output of the comparator 161b is changed from a high potential to a low potential. Thus, the output of the latch circuit is inverted to a low potential, and the direction of the current output from the current generator circuit 200 is reversed again in the direction of charging the capacitor 155. By repeating such a series of operations, a triangle wave is output from the triangle-wave generator circuit 111.

Note that as is clear from the above operations, the oscillation frequency of the triangle wave output from the triangle-wave generator circuit 111 is lower as the difference between the upper limit voltage VREFH and the lower limit voltage VREFL is larger, as the capacitance of the capacitor 155 is larger, and as the amount of current output from the current generator circuit 200 is smaller.

Next, an example of a configuration of the current generator circuit 200 will be described.

Figure 3:
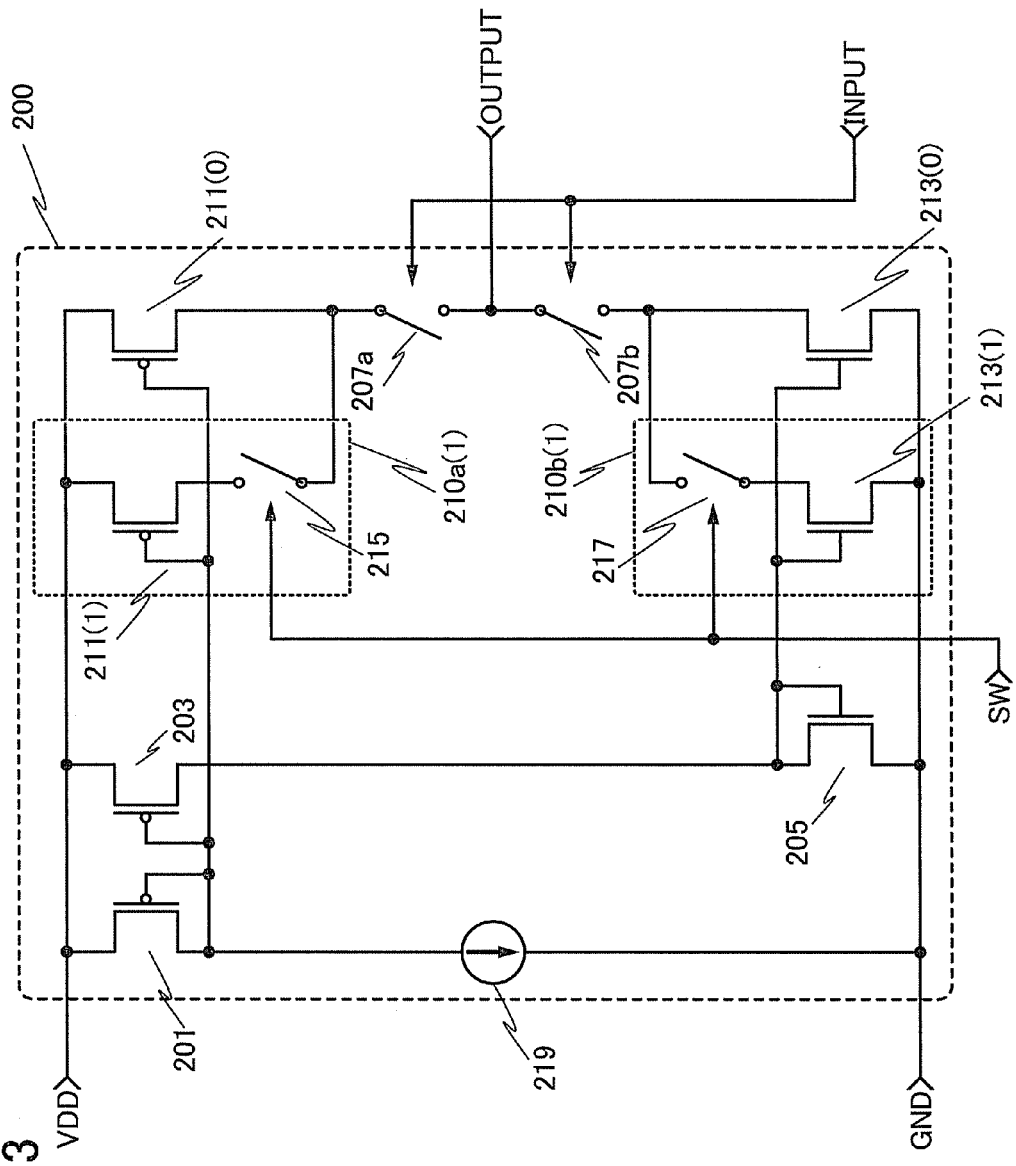
FIG. 3 is a circuit diagram illustrating one embodiment of the present invention.

FIG. 3 is a circuit diagram of the current generator circuit 200 exemplified in this embodiment. The current generator circuit 200 includes a power supply line VDD to which a power supply potential is applied, and a ground potential line GND to which a ground potential is applied. An input terminal INPUT is supplied with an output signal from the above latch circuit 153. A signal line SW is supplied with a control signal from the load current detector circuit 103. From an output terminal OUTPUT, a forward or reverse current generated in the current generator circuit 200 is output.

The current generator circuit 200 includes a plurality of transistors (a transistor 201, a transistor 203, a transistor 205, a transistor 211(0), a transistor 211(1), a transistor 213(0), and a transistor 213(1)), a plurality of switches (a switch 215, a switch 217, a switch 207a, and a switch 207b), and a constant current source 219. Here, the transistors 201, 203, 211(0), and 211(1) are p-channel transistors, and the transistors 205, 213(0), and 213(1) are n-channel transistors.

The transistors 203, 211(0), and 211(1) are connected to the transistor 201 to constitute current mirrors. That is, a gate and one of a source and a drain of the transistor 201 are connected to each other, and the gate of the transistor 201 is connected to gates of the transistors 203, 211(0), and 211(1).

For example, when a current flowing through the transistor 201 (i.e., a current flowing through the constant current source 219) is denoted by $I_{ref}$ and the size of the transistor 201 is denoted by $M_{ref}$, a current I flowing through a transistor that is connected to the transistor 201 to constitute a current mirror and is M in size is equal to $I_{ref} \times M/M_{ref}$. Therefore, a current flowing through the transistors 203, 211(0), and 211(1) is uniquely determined by their sizes and the value of current from the constant current source 219.

A current flowing through the transistor 211(1) is controlled by the switch 215. The switch 215 is controlled with a signal input from the above-described load current detector circuit 103. The current described above flows through the transistor 211(1) when the switch 215 is on, and is interrupted when the switch 215 is off.

Furthermore, the transistors 213(0) and 213(1) are connected to the transistor 205 to constitute current mirrors. That is, a gate and one of a source and a drain of the transistor 205 are connected to each other, and the gate of the transistor 205 is connected to gates of the transistors 213(0) and 213(1).

Since the transistors 203 and 205 are connected in series with each other, the current flowing through the transistor 203 and the current flowing through the transistor 205 are equal in amount. Therefore, a current flowing through the transistors 213(0) and 213(1) is uniquely determined by their sizes and the value of current supplied from the constant current source 219.

The amount of current flowing through the transistor 213(1) is controlled by the switch 217. The on/off state of the switch 217 is controlled with a signal input from the load current detector circuit 103 in a manner similar to the above.

Here, in this specification and the like, a switch for controlling current, which corresponds to the switches 215 and 217, means a functional element that controls two states (a state where a current flows through the transistor electrically connected to the switch and a state where a current is interrupted) with a signal output from the above-described load current detector circuit 103. Accordingly, in this configuration, such a switch is connected in series with the transistor in order to interrupt current; however, the configuration is not limited to this, and the configuration, position, and the like of a switch can be freely set as long as a current flowing through the transistors 211(1) and 213(1) can be interrupted. For example, a current may be controlled by employing a configuration in which a voltage applied to the gates of the transistors 211(1) and 213(1) is controlled to control the on/off state of the transistors.

The switches 207a and 207b are controlled to be alternately turned on and off with an output signal from the latch circuit 153 illustrated in FIGS. 2A and 2B. For example, when the switch 207a is on and the switch 207b is off, a current flowing through the switch 207a flows from the output terminal (OUTPUT) toward the capacitor 155 in the triangle-wave generator circuit 111, that is, flows in the direction of charging the capacitor 155. On the other hand, when the switch 207a is off and the switch 207b is on, a current flows in the direction opposite to the above case, that is, the direction of discharging the capacitor 155.

Here, in the current generator circuit 200 described in this embodiment, the amount of current charged to and discharged from the capacitor 155 can be changed with a control signal input, from the load current detector circuit 103 to the signal line SW. The amount of current output from the current generator circuit 200 will be described below.

The amount (value) of current that flows in the direction of charging the capacitor 155 when the switch 207a is on (also referred to as a charging current) is denoted by $I_p$. The value $I_p$ at the time when the switch 215 is off is equal to a value $I_{p0}$ of current flowing through the transistor 211(0). On the other hand, $I_p$ at the time when the switch 215 is on is the sum of the value $I_{p0}$ of current flowing through the transistor 211(0) and a value $I_{p1}$ of current flowing through the transistor 211(1).

Similarly, the amount (value) of current that flows in the direction of discharging the capacitor 155 when the switch 207b is on (also referred to as a discharging current) is denoted by $I_n$. The value $I_n$ at the time when the switch 217 is off is equal to a value $I_{n0}$ of current flowing through the transistor 213(0). On the other hand, $I_n$ at the time when the switch 217 is on is the sum of a value $I_{n1}$ of current flowing through the transistor 213(1) and $I_{n0}$.

Here, a structural unit that includes a transistor connected to the transistor 201 or the transistor 205 to constitute a current mirror and a switch for controlling the transistor and is shown by dotted lines in FIG. 3 is called a current mirror (a current mirror 210a(1) and a current mirror 210b(1) in this configuration). A current mirror can output a constant current and control whether to output the current or not by a switch therein.

The switch used in this configuration can be any switching element whose on/off state can be controlled, and an n-channel transistor, a p-channel transistor, or a switching element formed by combining these transistors (e.g., an analog switch) can be used.

With the above-described configuration, the value of current output from the current generator circuit 200 can be changed with a control signal input to the current generator circuit 200 from the load current detector circuit 103 through the signal line SW. In other words, the oscillation frequency of a triangle wave output from the triangle-wave generator circuit 111 can be changed by changing the value of the output current of the current generator circuit 200 in accordance with the amount of load current output from the DCDC converter 100. This leads to a change in the sampling frequency of the control circuit 110. Here, an output signal of the load current detector circuit 103 is preferably set so that the sampling frequency can be appropriate depending on the amount of load current.

In this embodiment, one current mirror is provided for each of the charging current source and the discharging current source; alternatively, a plurality of current mirrors may be provided in parallel. When a plurality of current mirrors is provided and their currents are controlled, the range of choices for the output current of the current generator circuit 200 is expanded, so that the value of the output current can be set more minutely. Thus, the sampling frequency of the control circuit 110 can be set minutely.

Further, by using transistors with various sizes as transistors included in current mirrors, the variable range of output current of the current generator circuit 200 can be expanded. For example, when the size of the transistor 211(0) is M and the size of the transistor 211(1) is 9×M in the configuration in FIG. 3, the amount of current that can be output by controlling the on/off state of the switch 215 can be increased up to 10 times. The sizes of transistors included in the current mirrors can be set as appropriate in accordance with a desired variable range of sampling frequency, in consideration of the number of stages of the current mirrors.

In the configuration described in this embodiment, the value of the output current of the current generator circuit 200 can be changed while the current value of the constant current source 219 is fixed. Consequently, even when the amount of the output current of the current generator circuit 200 is largely changed, it is ensured that transistors included in the current mirrors always operate in the saturation region without changing the current value flowing through the transistors; thus, the current mirror circuit operates normally. That is, with such a configuration, the current generator circuit can have a wide variable range of output current and operates stably.

A control circuit that uses a triangle wave output from a triangle-wave generator circuit including the above current generator circuit can have a wide variable range of sampling frequency. In addition, a DCDC converter including such a control circuit can realize optimal power efficiency regardless of power consumption of a load circuit.

Note that this embodiment can be implemented in combination with any other embodiment described in this specification as appropriate.

(Embodiment 2)

In this embodiment, a more specific example of the configuration of the current generator circuit described in Embodiment 1 will be described with reference to FIG. 4. Note that the configuration and functions described in this embodiment have a lot in common with those in Embodiment 1; therefore, the description is not repeated or is simplified for portions with the same configuration or function as Embodiment 1.

Figure 4:
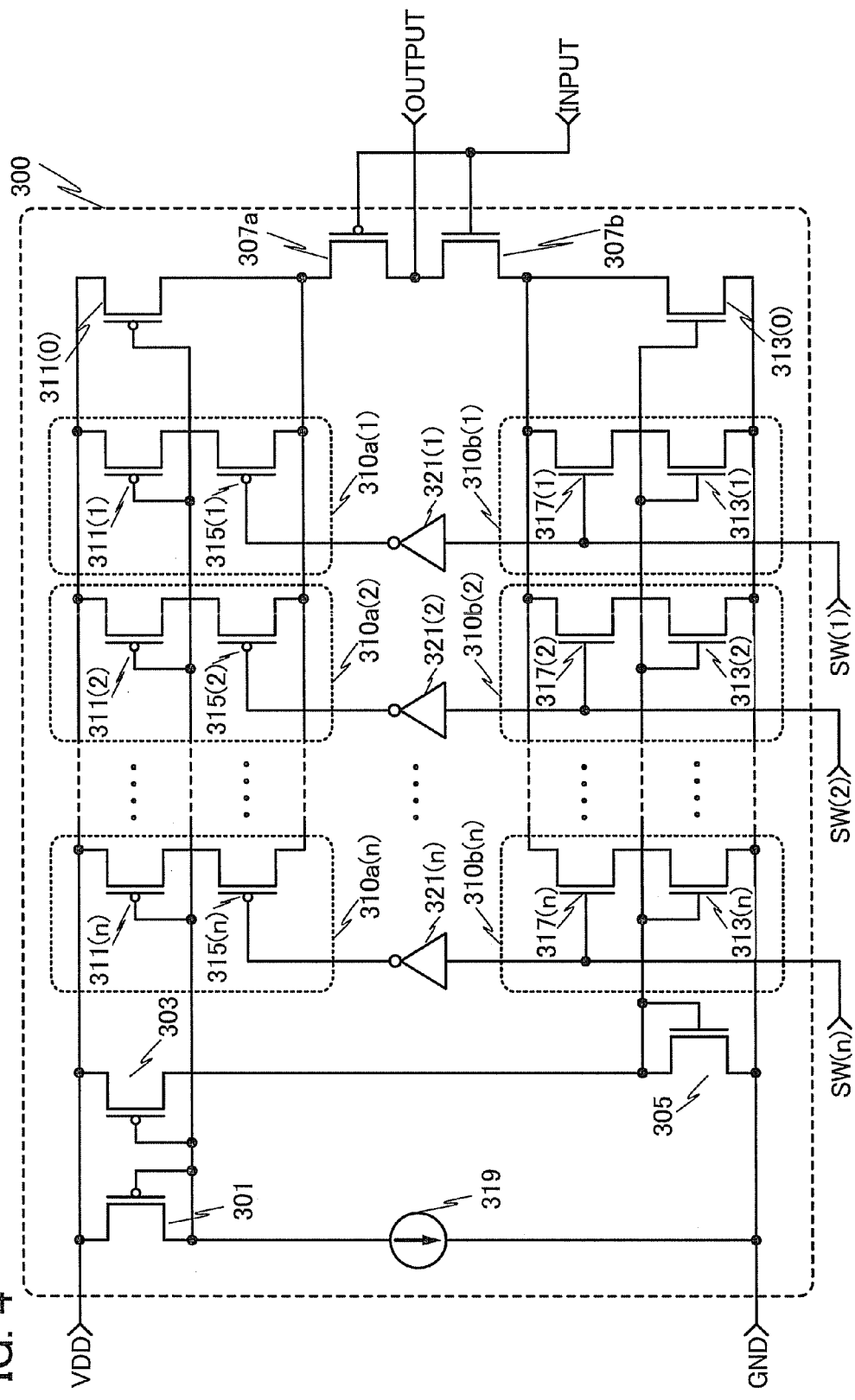
FIG. 4 is a circuit diagram illustrating one embodiment of the present invention.

FIG. 4 is a circuit diagram illustrating a configuration of a current generator circuit 300 exemplified in this embodiment. As in the current generator circuit 200 described in Embodiment 1, a power supply line VDD, a ground potential line GND, and an input terminal INPUT are connected to the current generator circuit 300. A plurality of signal lines SW(1 to n) is supplied with a control signal from the load current detector circuit 103. From an output terminal OUTPUT, a forward or reverse current generated in the current generator circuit 300 is output.

The current generator circuit 300 includes a transistor 301, and a transistor 303 and a transistor 311(0) whose gates are connected to a gate and a second electrode of the transistor 301. First electrodes of the transistors 301, 303, and 311(0) are connected to the power supply line VDD. The second electrode of the transistor 301 is connected to a constant current source 319. A second electrode of the transistor 303 is connected to a first electrode of a transistor 305. A gate and the first electrode of the transistor 305 are connected to a gate of a transistor 313(0). Second electrodes of the transistors 305 and 313(0) are connected to the ground potential line GND.

Here, a structural unit including a transistor 311(n) and a transistor 315(n) is called a current minor 310*a*(n), and a structural unit including a transistor 313(n) and a transistor 317(n) is called a current mirror 310*b*(n). The current generator circuit 300 includes n stages of current mirrors 310*a*(1 to n) connected in parallel with each other and n stages of current mirrors 310*b*(1 to n) connected in parallel with each other. Moreover, n inverters 321(1 to n) are provided corresponding to these current mirrors. Here, n is a natural number of 1 or more.

In the current mirror 310*a*(n), a first electrode of the transistor 311(n) is connected to the power supply line VDD, a second electrode thereof is connected to a first electrode of the transistor 315(n), and a gate thereof is connected to the gate and the second electrode of the transistor 301. Second electrodes of the transistor 311(0) and a plurality of transistors 315(1 to n) are connected to a first electrode of a transistor 307*a*. Further, in the current mirror 310*b*(n), a second electrode of the transistor 313(n) is connected to the ground potential line GND, a first electrode thereof is connected to a second electrode of the transistor 317(n), and a gate thereof is connected to the gate and the first electrode of the transistor 305. First electrodes of the transistor 313(0) and a plurality of transistors 317(1 to n) are connected to a second electrode of a transistor 307*b*.

A gate of the transistor 317(n) is connected to one of n signal lines (the signal line SW(n)) and is electrically connected to a gate of the transistor 315(n) through the inverter 321(n).

A second electrode of the transistor 307*a* is connected to a first electrode of the transistor 307*b*, and a node therebetween corresponds to the output terminal OUTPUT that outputs an output current of the current generator circuit 300. Further, gates of the transistors 307*a* and 307*b* are connected to the input terminal INPUT.

Here, the transistor 301, the transistor 303, the transistor 307*a*, the transistor 311(0), the plurality of transistors 311(1 to n), and the plurality of transistors 315(1 to n) are p-channel transistors. The transistor 305, the transistor 307*b*, the transistor 313(0), the plurality of transistors 313(1 to n), and the plurality of transistors 317(1 to n) are n-channel transistors.

A current flowing through each of the transistor 311(0) and the plurality of transistors 311(1 to n) is proportional to the ratio of the size of the transistor 301 to their sizes and proportional to the current flowing through the transistor 301 (i.e., the current supplied from the constant current source 319). The on/off state of the current flowing through the transistor 315(n), that is, the current flowing through the current mirror 310*a*(n) is controlled by the transistor 315(n).

Since the transistors 303 and 305 are connected in series with each other, all the current flowing through the transistor 303 flows through the transistor 305. Further, for the same reason as above, a current flowing through each of the transistor 313(0) and the plurality of transistors 313(1 to n) is proportional to the ratio of the size of the transistor 305 to their sizes and proportional to the current flowing through the transistor 301 (i.e., the current supplied from the constant current source 319). The on/off state of the current flowing through the transistor 313(n), that is, the current flowing through the current mirror 310*b*(n) is controlled by the transistor 317(n).

A plurality of signal lines SW(1 to n) is supplied with a control signal output from the load current detector circuit 103 described in Embodiment 1. When the control signal input to the signal line SW(n) is a high-level signal, the transistor 317(n) and the transistor 315(n) are turned on, so that a current corresponding to the sizes of the transistors as described above flows through the current mirror 310*a*(n) and the current mirror 310*b*(n). On the other hand, when the control signal is a low-level signal, the transistor 317(n) and the transistor 315(n) are turned off, so that a current from the current mirrors is interrupted. A current flowing to the output terminal OUTPUT is the sum of the currents from the current mirrors in a state where a high-level control signal is input and a current flows therethrough. In such a manner, the output current from the current generator circuit 300 can be selected from a plurality of choices by a control signal input to the plurality of signal lines SW(1 to n).

The number of choices of current values that the current generator circuit 300 can output can be increased as the number of stages of current mirrors connected in parallel is larger. Meanwhile, when the number of stages is increased, the size of peripheral circuits such as the load current detector circuit 103 as well as the size of the current generator circuit 300 is somewhat increased. For that reason, the number of stages of current mirrors can be determined as appropriate in consideration of the size of these circuits, the variable range and a variable number of stages of a desired sampling frequency, and the like.

In addition, by adjusting the sizes of the transistor 311(0), the plurality of transistors 311(1 to n), the transistor 313(0), and the plurality of transistors 313(1 to n) as appropriate, the current generator circuit 300 can have a wider variable range of output current. For example, in the case where n is 2 and the size of the transistor 311(0) is $M_0$, the size of the transistor 311(1) is $9 \times M_0$, and the size of the transistor 311(2) is $90 \times M_0$, the output current of the current generator circuit can have a variable range up to 100 times as large at the maximum.

Here, since the sizes of the transistors 311(0) and 313(0) determine the minimum value of the output current of the current generator circuit 300, they are set as appropriate in accordance with a possible minimum load current in consideration of other design parameters of the triangle-wave generator circuit, a variable range of a desired sampling frequency, and the like.

The current generator circuit 300 exemplified in this embodiment is constituted only by transistors and thus can be smaller in size than a circuit having a configuration where an output current is made variable by switching resistors, for example.

In the current generator circuit 300 exemplified in this embodiment, the value of the output current from the current generator circuit 300 can be changed while the value of current supplied from the constant current source 319 is fixed. Consequently, even when the variable range of the output current of the current generator circuit 300 is widened, it is ensured that transistors included in the current mirrors always operate in the saturation region without changing the current value flowing through the transistors; thus, the current mirror circuit operates normally. That is, with such a configuration, the current generator circuit can have a wide variable range of output current.

A control circuit that uses a triangle wave output from a triangle-wave generator circuit including the above current generator circuit can have a wide variable range of sampling frequency. In addition, a DCDC converter including such a control circuit can realize optimal power efficiency regardless of power consumption of a load circuit.

Note that this embodiment can be implemented in combination with any other embodiment described in this specification as appropriate.

(Embodiment 3)

In this embodiment, an example of the configuration of the current generator circuit which is different from that in Embodiment 2 will be described with reference to FIG. 5. Note that the configuration and functions described in this embodiment have a lot in common with those in the above embodiments; therefore, the description is not repeated or is simplified for portions with the same configuration or function as the above embodiments.

Figure 5:
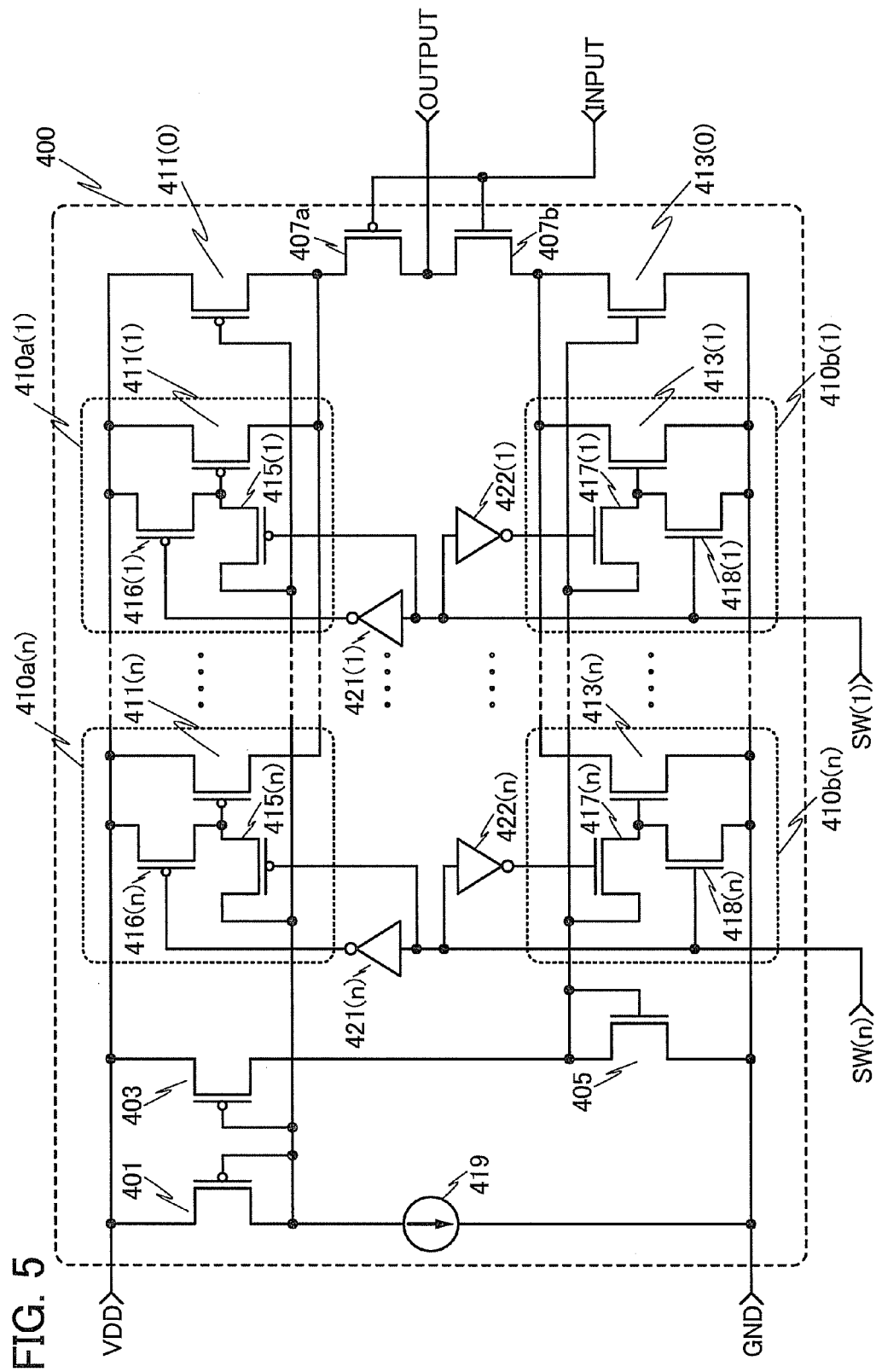
FIG. 5 is a circuit diagram illustrating one embodiment of the present invention.
Figure 6:
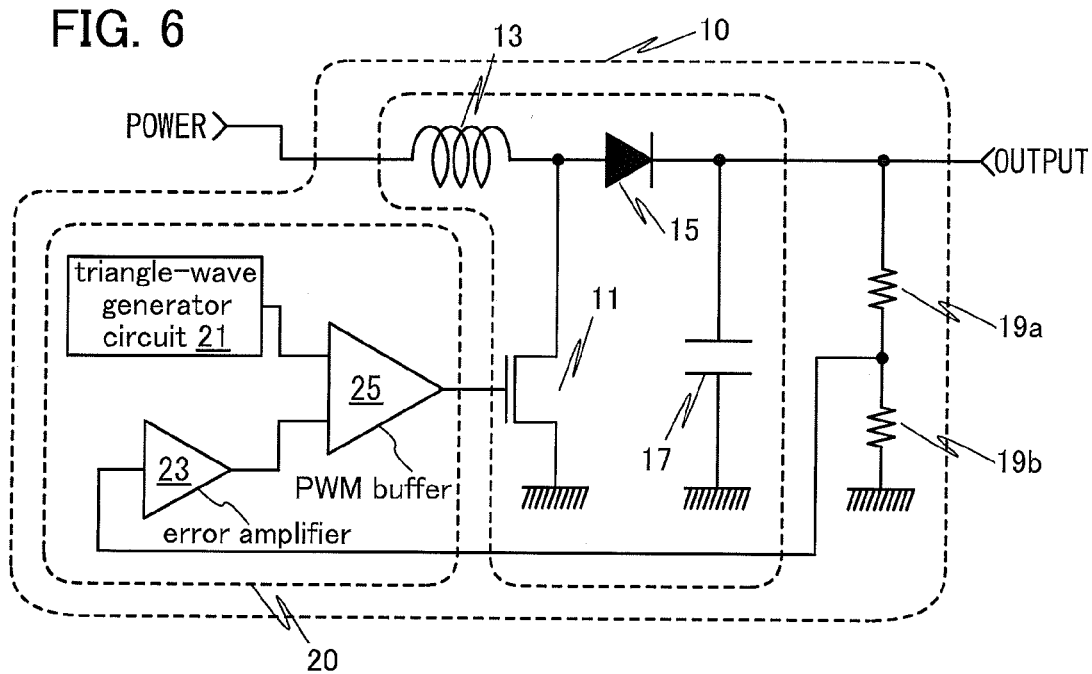
FIG. 6 is a circuit diagram illustrating a conventional technique.
Figure 7:
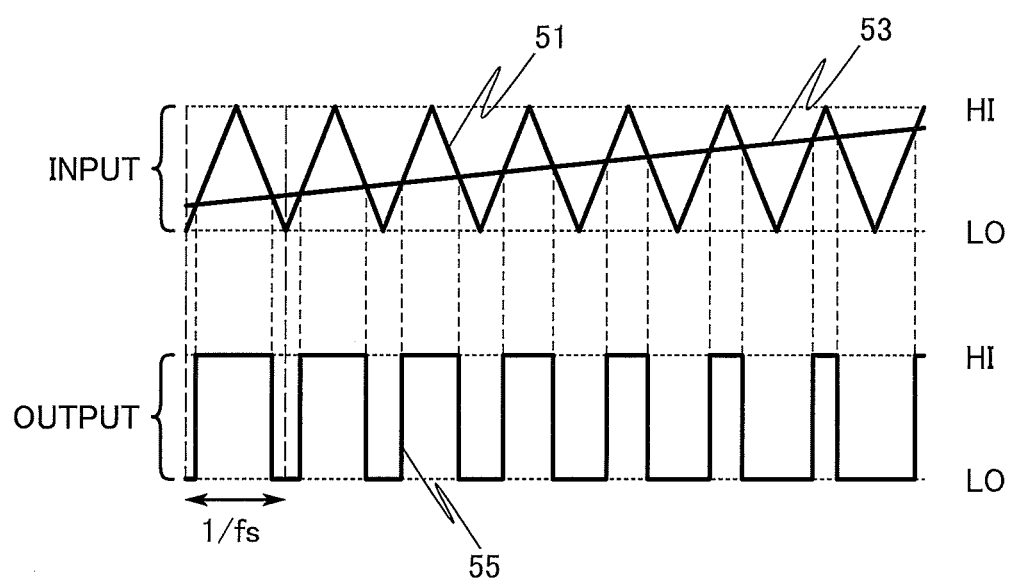
FIG. 7 is a schematic diagram of input and output signals for explaining a conventional technique.

FIG. 5 is a circuit diagram illustrating a configuration of a current generator circuit 400 exemplified in this embodiment. As in the current generator circuits described in the above embodiments, a power supply line VDD, a ground potential line GND, and an input terminal INPUT are connected to the current generator circuit 400. A plurality of signal lines SW(1 to n) is supplied with a control signal from the load current detector circuit 103. From an output terminal OUTPUT, a forward or reverse current generated in the current generator circuit 400 is output.

The current generator circuit 400 includes a transistor 401, and a transistor 403 and a transistor 411(0) whose gates are connected to a gate and a second electrode of the transistor 401. First electrodes of the transistors 401, 403, and 411(0) are connected to the power supply line VDD. The second electrode of the transistor 401 is connected to a constant current source 419. A second electrode of the transistor 403 is connected to a first electrode of a transistor 405. A gate and the first electrode of the transistor 405 are connected to a gate of a transistor 413(0). Second electrodes of the transistors 405 and 413(0) are connected to the ground potential line GND.

Here, a structural unit including a transistor 411(n), a transistor 415(n), and a transistor 416(n) is called a current mirror 410a(n), and a structural unit including a transistor 413(n), a transistor 417(n), and a transistor 418(n) is called a current mirror 410b(n). The current generator circuit 400 includes n stages of current mirrors 410a(1 to n) connected in parallel with each other and n stages of current mirrors 410b(1 to n) connected in parallel with each other. Moreover, n inverters 421(1 to n) and n inverters 422(1 to n) are provided corresponding to these current mirrors. Here, n is a natural number of 1 or more.

In the current mirror 410a(n), a first electrode of the transistor 415(n) is connected to the gate and the second electrode of the transistor 401, and a second electrode thereof is connected to a gate of the transistor 411(n) and a second electrode of the transistor 416(n). First electrodes of the transistors 416(n) and 411(n) are connected to the power supply line VDD. Second electrodes of the transistor 411(0) and a plurality of transistors 411(1 to n) are connected to a first electrode of a transistor 407a. Furthermore, in the current mirror 410b(n), a first electrode of the transistor 417(n) is connected to the gate and the first electrode of the transistor 405, and a second electrode thereof is connected to a gate of the transistor 413(n) and a first electrode of a transistor 418(n). Second electrodes of the transistors 418(n) and 413(n) are connected to the ground potential line GND. First electrodes of the transistor 413(0) and a plurality of transistors 413(1 to n) are connected to a second electrode of a transistor 407b.

A gate of the transistor 418(n) is connected to one of n signal lines (the signal line SW(n)) and a gate of the transistor 415(n), is electrically connected to the transistor 417(n) through the inverter 422(n), and is electrically connected to the transistor 416(n) through the inverter 421(n).

A second electrode of the transistor 407a is connected to a first electrode of the transistor 407b, and a node therebetween corresponds to the output terminal OUTPUT that outputs an output current of the current generator circuit 400. Further, gates of the transistors 407a and 407b are connected to the input terminal INPUT.

Here, the transistor 401, the transistor 403, the transistor 407a, the transistor 411(0), the plurality of transistors 411(1 to n), the plurality of transistors 415(1 to n), and the plurality of transistors 416(1 to n) are p-channel transistors. The transistor 405, the transistor 407b, the transistor 413(0), the plurality of transistors 413(1 to n), the plurality of transistors 417(1 to n), and the plurality of transistors 418(1 to n) are n-channel transistors.

In the current mirror 410a(n), a gate of the transistor 416(n) is supplied with a signal whose level is inverted by the inverter 421(n) from that of a signal supplied to the gate of the transistor 415(n). That is, when the transistor 415(n) is on, the transistor 416(n) is off; whereas when the transistor 415(n) is off, the transistor 416(n) is on.

When the transistor 415(n) is on, the gate of the transistor 411(n) is supplied with a voltage of a node connected to the gate and second electrode of the transistor 401, and current mirror connection of the transistor 401 and the transistor 411(n) is realized. Thus, the transistor 411(n) is supplied with a current corresponding to the size of the transistor 411(n). On the other hand, when the transistor 416(n) is on, the transistor 411(n) is turned off because the power supply voltage is input to the gate of the transistor 411(n), and a current from the current mirror 410a(n) is interrupted.

In addition, in the current mirror 410b(n), a gate of the transistor 417(n) is supplied with a signal whose level is inverted from that of a signal supplied to the gate of the transistor 418(n), through the inverter 422(n). That is, when the transistor 417(n) is on, the transistor 418(n) is off; whereas when the transistor 417(n) is off, the transistor 418(n) is on.

When the transistor 417(n) is on, the gate of the transistor 413(n) is supplied with a voltage of a node connected to the gate and first electrode of the transistor 405, and current mirror connection of the transistor 405 and the transistor 413(n) is realized. Thus, the transistor 413(n) is supplied with a current corresponding to the size of the transistor 413(n). On the other hand, when the transistor 418(n) is on, the transistor 413(n) is turned off because the ground voltage is input to the gate of the transistor 413(n), and a current from the current mirror 410b(n) is interrupted.

The signal lines SW are supplied with a control signal output from the load current detector circuit 103 described in Embodiment 1. When the control signal input to the signal line SW(n) is a high-level signal, the transistors 418(n) and 416(n) are on and the transistors 415(n) and 417(n) are off, so that a current from the two current mirrors (the current mirrors 410a(n) and 410b(n)) is interrupted. On the other hand, when the control signal is a low-level signal, the transistors 418(n) and 416(n) are off and the transistors 415(n) and 417(n) are on, so that a current flows from the two current mirrors (the current mirrors 410a(n) and 410b(n)).

As described above, a current from each of the current mirrors can be interrupted as appropriate by a control signal input to the signal lines SW. Thus, the output current of the current generator circuit 400 can be changed in accordance with the control signal.

In the configuration described in this embodiment, the number of transistors included in the current mirror is larger than that in the configuration in Embodiment 2 by one. With such a configuration, the adverse effect of on-resistance of transistors themselves can be suppressed when such effect cannot be ignored in low-current driving, for example. In other words, by employing the configuration in which a control transistor is not provided in series with transistors connected to constitute current mirrors, such as the configuration of the current generator circuit 400 described in this embodiment, the adverse effect of on-state current of the transistors can be eliminated, and lower-current driving can be realized.

A control circuit that uses a triangle wave output from a triangle-wave generator circuit including the above current generator circuit can have a wide variable range of sampling frequency. In addition, a DCDC converter including such a control circuit can realize optimal power efficiency regardless of power consumption of a load circuit.

Note that this embodiment can be implemented in combination with any other embodiment described in this specification as appropriate.

This application is based on Japanese Patent Application serial No. 2010-222036 filed with Japan Patent Office on Sep. 30, 2010, the entire contents of which are hereby incorporated by reference.

What is claimed is:

1. A control circuit comprising:
a first potential line, a second potential line, a signal line, and a current generator circuit comprising:
a constant current source;
a first diode-connected transistor, the first diode-connected transistor being connected in series with the constant current source between the first potential line and the second potential line;
a third transistor connected between the first potential line and the second potential line and comprising a gate connected to a gate of the first diode-connected transistor;
current mirrors electrically connected to the first potential line in parallel with each other, each comprising a fourth transistor and one further comprising a fifth transistor and a sixth transistor; and
an output terminal,
wherein the fourth transistors are connected between the first potential line and the output terminal,
wherein, in the one of the current mirrors, the fifth transistor and the sixth transistor are connected in series between the first potential line and the gate of the first diode-connected transistor, and a gate of the fourth transistor is connected to a node between the fifth transistor and the sixth transistor,
wherein the current generator circuit is configured to transmit a control signal of the signal line to a gate of the sixth transistor, and to transmit an inverse of the control signal to a gate of the fifth transistor, and
wherein currents outputted by the current mirrors can be supplied to the output terminal.

2. The control circuit according to claim 1, wherein the control signal is output from a load current detector circuit in accordance with a load current flowing through a load circuit configured to be electrically connected to a DCDC converter of which the current generator circuit is a part.

3. The control circuit according to claim 1, wherein a ratio of channel width to channel length of the fourth transistor of one of the current mirrors is different from that of another one of the current mirrors.

4. The control circuit according to claim 1, wherein the first diode-connected transistor is a p-type transistor.

5. A DCDC converter comprising the control circuit according to claim 1.

6. The control circuit according to claim 1,
wherein the first diode-connected transistor, the third transistor, the fourth transistors, the fifth transistor, and the sixth transistor have a same conductivity type.

7. The control circuit according to claim 1,
wherein output terminals of the current mirrors are connected to the output terminal of the current generator circuit via an output switch.

8. A control circuit comprising:
a first potential line, a second potential line, a signal line, and a current generator circuit comprising:
a constant current source;
a first diode-connected transistor of a first conductivity type, the first diode-connected transistor being connected in series with the constant current source between the first potential line and the second potential line;
a second diode-connected transistor of a second conductivity type different from the first conductivity type;
a third transistor of the first conductivity type and comprising a gate connected to a gate of the first diode-connected transistor, the second diode-connected transistor and the third transistor being connected in series between the first potential line and the second potential line;
first current mirrors electrically connected to the first potential line in parallel with each other, each comprising a fourth transistor of the first conductivity type and one further comprising a fifth transistor and a sixth transistor;
second current mirrors electrically connected to the second potential line in parallel with each other, each comprising a seventh transistor of the second conductivity type and one further comprising an eighth transistor and a ninth transistor; and
an output terminal,
wherein the fourth transistors are connected between the first potential line and the output terminal,
wherein, in the one of the first current mirrors, the fifth transistor and the sixth transistor are connected in series between the first potential line and the gate of the first diode-connected transistor, and a gate of the fourth transistor is connected to a first node between the fifth transistor and the sixth transistor,
wherein the seventh transistors are connected between the second potential line and the output terminal,
wherein, in the one of the second current mirrors, the ninth transistor and the eighth transistor are connected in series between the second potential line and a gate of the second diode-connected transistor, and a gate of the seventh transistor is connected to a second node between the ninth transistor and the eighth transistor, wherein the current generator circuit is configured to transmit a control signal of the signal line to a gate of the sixth transistor and to a gate of the eighth transistor, and to transmit an inverse of the control signal to a gate of the fifth transistor and to a gate of the ninth transistor, and wherein currents outputted by the first current mirrors and the second current mirrors can be supplied to the output terminal.

9. The current generator circuit according to claim 8, wherein the control signal is output from a load current detector circuit in accordance with a load current flowing through a load circuit configured to be electrically connected to a DCDC converter of which the current generator circuit is a part.

10. The current generator circuit according to claim 8, wherein a ratio of channel width to channel length of the fourth transistor of one of the first current mirrors is different from that of another one of the first current mirrors.

11. The current generator circuit according to claim 8, the first conductivity type is that of a p-type transistor.

12. A DCDC converter comprising the current generator circuit according to claim 8.

13. The current generator circuit according to claim 8, wherein the first diode-connected transistor, the third transistor, the fourth transistors, the fifth transistor, and the sixth transistor are of the first conductivity type, and wherein the second diode-connected transistor, the seventh transistors, the eighth transistor, and the ninth transistor are of the second conductivity type.

14. The current generator circuit according to claim 8, wherein output terminals of the first current mirror are connected to the output terminal of the current generator circuit via a first output switch, and wherein output terminals of the second current mirrors are connected to the output terminal of the current generator circuit via a second output switch.

* * * * *